United States Patent
Van Den Brand et al.

(10) Patent No.: US 9,338,894 B2
(45) Date of Patent: May 10, 2016

(54) METHOD AND APPARATUS FOR ASSEMBLING ELECTRIC COMPONENTS ON A FLEXIBLE SUBSTRATE AS WELL AS ASSEMBLY OF AN ELECTRIC COMPONENT WITH A FLEXIBLE SUBSTRATE

(75) Inventors: Jeroen Van Den Brand, Delft (NL); Roel Henry Louis Kusters, Delft (NL); Andreas Heinrich Dietzel, Delft (NL)

(73) Assignee: Nederlandse Organisatie voor toegepast-natuurwetenschappelijk onderzoek TNO, Delft (NL)

(*) Notice: Subject to any disclaimer, the term of this patent is extended or adjusted under 35 U.S.C. 154(b) by 520 days.

(21) Appl. No.: 13/990,823

(22) PCT Filed: Dec. 2, 2011

(86) PCT No.: PCT/NL2011/050830
§ 371 (c)(1),
(2), (4) Date: Sep. 16, 2013

(87) PCT Pub. No.: WO2012/074405
PCT Pub. Date: Jun. 7, 2012

(65) Prior Publication Data
US 2014/0069697 A1    Mar. 13, 2014

(30) Foreign Application Priority Data
Dec. 3, 2010  (EP) .................................... 10193724

(51) Int. Cl.
*H05K 1/00* (2006.01)
*H05K 3/30* (2006.01)
(Continued)

(52) U.S. Cl.
CPC .............. *H05K 3/32* (2013.01); *H01L 23/4985* (2013.01); *H01L 24/24* (2013.01); *H01L 24/76* (2013.01);
(Continued)

(58) Field of Classification Search
CPC .......... H05K 1/189; H05K 2203/1545; H05K 1/0283; Y10T 29/49133; Y10T 29/53178
USPC ..................... 174/254; 29/740, 825, 830, 834
See application file for complete search history.

(56) References Cited

U.S. PATENT DOCUMENTS 5,639,693 A   6/1997  Koseki et al.
5,667,884 A   9/1997  Bolger
(Continued)

FOREIGN PATENT DOCUMENTS

EP  1746869 A1  1/2007
EP  2066159 A1  6/2009
(Continued)

OTHER PUBLICATIONS

International Search Report—PCT/NL2011/050830—Mailing Date: Feb. 27, 2012.
(Continued)

*Primary Examiner* — Sherman Ng
(74) *Attorney, Agent, or Firm* — Banner & Witcoff, Ltd.

(57) ABSTRACT

A method is presented for assembling a component (30) with a flexible substrate (10), the component having electric contacts (31). The method comprises the steps of
  placing the component (30) on a first main side (11) of the substrate,
  applying a machine vision step to estimate a position of the electric contacts,
  depositing one or more layers (32) of an electrically conductive material or a precursor thereof, said layer extending over an area of the substrate defined by the component to laterally beyond said area,
  calculating partitioning lines depending on the estimated position of the electric contacts,
  partitioning the layer into mutually insulated areas (32d) by locally removing material from said layer along said partitioning lines.
Also an apparatus is presented that is suitable for carrying out the method.
In addition an assembly is present that can be obtained by the method and the apparatus according to the invention.

9 Claims, 7 Drawing Sheets

(51) Int. Cl.
*H05K 3/32* (2006.01)
*H01L 23/498* (2006.01)
*H01L 23/00* (2006.01)
*H05K 1/18* (2006.01)
*H05K 1/02* (2006.01)
*H05K 3/12* (2006.01)

(52) U.S. Cl.
CPC .............. *H01L 24/82* (2013.01); *H05K 1/0283* (2013.01); *H05K 1/189* (2013.01); *H01L 2224/2405* (2013.01); *H01L 2224/24051* (2013.01); *H01L 2224/24226* (2013.01); *H01L 2224/25171* (2013.01); *H01L 2224/25175* (2013.01); *H01L 2224/766* (2013.01); *H01L 2224/767* (2013.01); *H01L 2224/76155* (2013.01); *H01L 2224/76261* (2013.01); *H01L 2224/82102* (2013.01); *H01L 2224/82104* (2013.01); *H01L 2224/82106* (2013.01); *H01L 2224/82874* (2013.01); *H01L 2224/9202* (2013.01); *H01L 2224/92144* (2013.01); *H01L 2924/0103* (2013.01); *H01L 2924/01006* (2013.01); *H01L 2924/0106* (2013.01); *H01L 2924/01013* (2013.01); *H01L 2924/01023* (2013.01); *H01L 2924/01025* (2013.01); *H01L 2924/01029* (2013.01); *H01L 2924/01033* (2013.01); *H01L 2924/01047* (2013.01); *H01L 2924/01079* (2013.01); *H01L 2924/10253* (2013.01); *H01L 2924/12042* (2013.01); *H05K 3/12* (2013.01); *H05K 3/305* (2013.01); *H05K 2201/10674* (2013.01); *H05K 2203/107* (2013.01); *H05K 2203/1469* (2013.01); *H05K 2203/1545* (2013.01); *H05K 2203/175* (2013.01); *Y10T 29/49133* (2015.01); *Y10T 29/53178* (2015.01)

(56) References Cited

U.S. PATENT DOCUMENTS

| | | | |
|---|---|---|---|
| 6,210,771 | B1 | 4/2001 | Post et al. |
| 2002/0134422 | A1 | 9/2002 | Bauman et al. |
| 2003/0022403 | A1 | 1/2003 | Shimoda et al. |
| 2004/0192082 | A1 | 9/2004 | Wagner et al. |
| 2005/0011861 | A1 | 1/2005 | Choo et al. |
| 2005/0252828 | A1* | 11/2005 | Takahashi ......... H01L 23/49565 206/713 |
| 2007/0123001 | A1 | 5/2007 | Reis |
| 2007/0134849 | A1* | 6/2007 | Vanfleteren ......... H01L 23/5389 438/123 |
| 2007/0184743 | A1* | 8/2007 | Nordlinder ............. B32B 38/10 442/376 |
| 2007/0215039 | A1* | 9/2007 | Edwards ............. H01M 4/8626 118/46 |
| 2007/0230103 | A1* | 10/2007 | Baumann ......... G06K 19/07718 174/521 |
| 2008/0012121 | A1 | 1/2008 | Hara |
| 2008/0257589 | A1 | 10/2008 | Ostmann et al. |
| 2009/0158232 | A1 | 6/2009 | Ronkka et al. |
| 2009/0283891 | A1 | 11/2009 | Dekker et al. |
| 2010/0062351 | A1 | 3/2010 | Hidaka |

FOREIGN PATENT DOCUMENTS

| | | |
|---|---|---|
| EP | 2200412 A1 | 6/2010 |
| GB | 2313713 A | 12/1997 |
| JP | S5445574 A | 4/1979 |
| JP | 55896742 A | 6/1983 |
| JP | 2001-135910 A | 5/2001 |
| JP | 2004-281738 A | 10/2004 |
| JP | 2007207880 A | 8/2007 |
| TW | I278394 B | 4/2007 |
| TW | 201015238 A | 4/2010 |
| WO | 03021679 A2 | 3/2003 |
| WO | 2004014657 A2 | 2/2004 |
| WO | 2008/102866 A1 | 8/2008 |
| WO | 2009033728 A2 | 3/2009 |
| WO | 2009070018 A1 | 6/2009 |
| WO | 2010000225 A1 | 1/2010 |
| WO | 2010000252 A1 | 1/2010 |
| WO | 2010071426 A1 | 6/2010 |

OTHER PUBLICATIONS

International Search Report—PCT/NL2011/050092—mailing Date: Jun. 20, 2011.

Stretchable Electronic Systems. T Löher, et al, IEEE, Proc. 2006 Electronics Packaging Technology Conference, 271.

* cited by examiner

METHOD AND APPARATUS FOR ASSEMBLING ELECTRIC COMPONENTS ON A FLEXIBLE SUBSTRATE AS WELL AS ASSEMBLY OF AN ELECTRIC COMPONENT WITH A FLEXIBLE SUBSTRATE

CROSS-REFERENCE TO RELATED APPLICATIONS

This application is a U.S. National Stage application under 35 U.S.C. §371 of International Application PCT/NL2011/050830, filed Dec. 2, 2011, which claims priority to Application EP 10193724.1, filed Dec. 3, 2010. Benefit of the filing date of each of these prior applications is hereby claimed. Each of these prior applications is hereby incorporated by reference in its entirety.

BACKGROUND

1. Field of the Invention

The present invention relates to a method for assembling electric components on a flexible substrate.

The present invention further relates to an apparatus for assembling electric components on a flexible substrate.

The present invention further relates to an assembly of an electric component with a flexible substrate.

2. Related Art

Flexible electronic products become more and more important, for example in the form of smart textiles, flexible displays and the like. Flexible electronic products mostly require the incorporation of semiconductor devices to steer and monitor various aspects of the device. As electronic devices generally become more and more complex, also the chips that steer them tend to become more and more complex. This results in higher IO counts, lower pitches and linewidths. This will in turn also result in higher requirements towards the placement accuracy of the integrated circuit when bonding. Apart from semiconductor devices other electric components, also batteries may have to be integrated with the flexible electronic product. The desired flexibility of the product often requires the placement and interconnection of thinned (<30 μm) Si chips. Typically required placement accuracies are in the order of 10-20 μm. These semiconductor devices and other electric components have a substantially smaller lateral size than the surface at which they are mounted. This prohibits the use of machinery that is normally used to laminate various foils together. Instead pick&place equipment has to be used to place these electric components.

A roll to roll manufacturing process is desired. Potentially this allows assembly of the electronic product in large sizes and quantities at low costs, e.g. using production processes such as presently used in the paper printing industry.

The placement of large amounts of chips with a high accuracy on a continuously moving belt would require quite advanced and expensive equipment. Furthermore, each chip would need to be bonded individually which could take seconds per chip.

Assembling methods are known that allow components to be placed with less accuracy by estimating a position of contacts of the components after their placement and adapting the connections to the estimated position.

In this respect it is noted that GB 2 313 713 describes a high-density mounting method for making an electronic circuit board. Therein a stud bump is formed on a connection terminal of a semiconductor chip. The semiconductor chip is buried in a printed circuit board such that the stud bump has a height almost equal to that of a surface of the printed circuit board. At least a surface of the printed circuit board where the semiconductor chip is buried is covered with a first insulating layer. Holes are formed in the first insulating layer by using a laser to expose the stud bump. A circuitry pattern is selectively formed on the first insulating layer, thereby connecting the circuitry pattern and the exposed stud bump to each other, and to other circuitry on the surface of the board.

It is further noted that US2007/230103 provides a method and apparatus for integrating electronic components on conductor tracks as well as corresponding electronic components. The disclosed method and apparatus allow the electronic component to be applied with less precision on a printing material such as a substrate to be printed or a printed product. After placement of the component, its position is determined by a sensor system, e.g. a camera system. In a subsequent processing step, one or more printing units print conductor tracks. The conductor tracks are oriented through registration of the printing unit or the conveyor mechanism to the previously applied electronic component.

WO/2010/071426, corresponding to EP2200412 A1 describes a method for manufacturing a flexible electronic product, the method comprising the steps of providing a flexible foil with a first and a second, mutually opposite main side, placing a component at the first foil at the first main side, the component having at least one electrical terminal facing towards the second main side, estimating a position of the at least one electrical terminal, adaptively forming a conductive path to the at least one electrical terminal, based on said estimated position.

According to an embodiment of the known method the conductive path is adaptively formed by forming a groove at the second main side of the foil and filling said groove with a conductive material or a precursor thereof.

In another embodiment the conductive path is formed by applying an adhesive layer and by converting the conductivity properties of the adhesive in a conversion zone thereof. The position and/or orientation of the conversion zone is dependent on the estimated position.

The processes of filling individual grooves in the first embodiment is relatively time consuming. The second embodiment requires relatively expensive materials. Accordingly, there is a need for a method, requiring relatively simple materials, which allows for a larger manufacturing throughput and which significantly relaxes the requirements for the chip placement alignment accuracy.

US2009/158232 provides a method comprising: examining the location of one or more feature(s) of component(s) of a circuit arrangement to determine a displacement of the location of communication contact(s) with respect to a designed location for the communication contact(s) of the components. Subsequently corrective communication path layout data of said circuit arrangement is provided based upon the said displacement(s). Then the communication path is applied according to the corrected communication path layout data.

SUMMARY OF THE INVENTION

According to a first aspect of the invention a method is provided as claimed in claim 1. According to a second aspect of the invention an apparatus is provided as claimed in claim 5.

According to a third aspect of the invention an assembly is provided as claimed in claim 8.

In the method and apparatus as claimed a patterned electrically conductive structure is obtained by locally removing a thin stripe of the electrically conductive material from the deposited layer. Due to the fact that only a thin stripe of material needs to be removed this can take place relatively fast, at a relatively low energy consumption and with a relatively low heat load for the component. The method and apparatus according to the invention makes it possible to provide for conductive paths having a varying width in a practical manner. For example the stripes of material can be removed by a laser providing a beam having a constant width. This makes it possible to have generally wide conductive paths, which narrow down where necessary.

The layer of electrically conductive material may be applied at the same side as the component when according to a first alternative the component is placed with electrical contacts facing away from the substrate. According to a second alternative the layer of electrically conductive material may be applied at a side of the substrate opposite to that where the component is placed, in case the component has electrical contacts facing towards from the substrate. In that case the method according to the first aspect of the invention has an additional step of applying perforations through the substrate that expose the electrical contacts of the components at said opposite side. The first alternative is advantageous in that the additional step of applying perforations in the substrate is not necessary. In the first alternative the surface of the substrate holding the component is smoothed by the layer of electrically conductive material over the component. In the second alternative the surface carrying the component may be smoothed by applying an encapsulation of a material, e.g. an adhesive over the component. It is an advantage of the second alternative that a transition may be even completely avoided if the component is sunken into a cavity formed in the substrate. The measures of arranging the component in a cavity and encapsulation of the component may be combined. Also both alternatives for electrically connecting the contacts of the component may be combined in case the component has electrical contacts facing towards the substrate as electrical contacts facing away from the substrate.

The electrically conductive material or precursor thereof used for the layer is for example an ink containing metal nano particles, for example a dispersion of silver nanoparticle in a dispersion liquid. Alternatively metal complexes in organic or water based solvents may be used for example silver complex inks, but other metal complexes based for example on copper, nickel, zinc, cobalt, palladium, gold, vanadium, and bismuth instead of silver may be used alternatively or in combination.

The layer may be deposited, e.g. by coating techniques, such as slot-die coating, kiss-coating, hot-melt coating, spray coating, etc. and all kinds of printing techniques, such as inkjet printing, gravure printing, flexographic printing, screen printing, rotary screen printing, etc.

The deposited layer may be cured by application of actinic radiation, by heating, e.g. by magnetron heating or a combination thereof.

The layer instead of by printing may be applied by vapor deposition or by electroplating. In that case curing is not necessary.

In the assembly according to the third aspect so obtained, the electrically conductive layer is partitioned by slits having a length/width ratio of at least 10, but preferably of at least 20. The conductive layer in the assembly can be obtained with a relatively modest power consumption and with a modest heat load to the component.

BRIEF DESCRIPTION OF THE DRAWINGS

These and other aspects are described in more detail with reference to the drawing. Therein:

FIGS. 8A, 8B shows a fourth embodiment of an assembly of an electronic component and a flexible substrate according to the third aspect of the present invention, therein FIG. 8B shows the finished product, and FIG. 8A shows a semifinished product, FIGS. 8A and 8B each show a top-view and a cross-section according to X-X indicated in the top-view.

DETAILED DESCRIPTION OF EMBODIMENTS

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

In the drawings, the size and relative sizes of layers and regions may be exaggerated for clarity.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

Like elements have like reference numerals.

Figure 1:
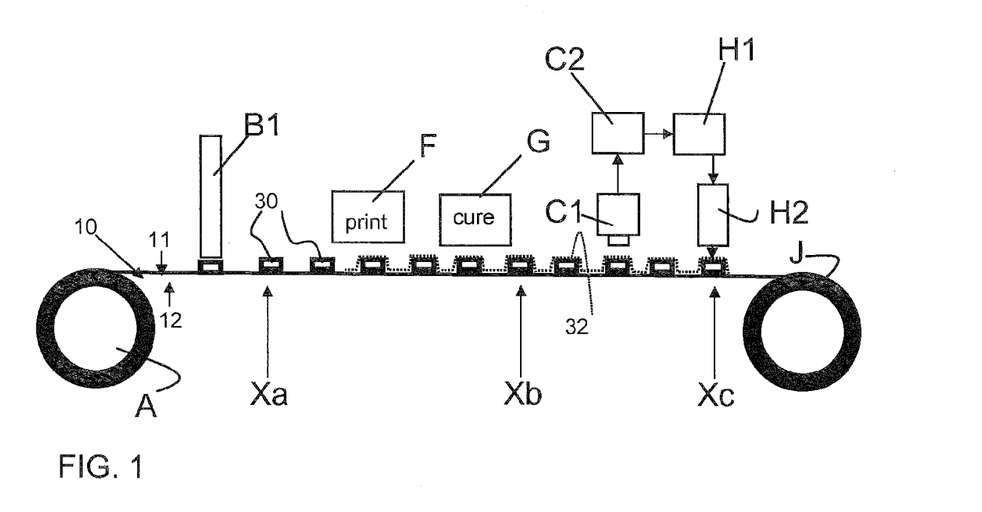
FIG. 1 shows a first embodiment of an apparatus according to the second aspect of the invention.

FIG. 1 illustrates an apparatus for assembling a component 30 having electric contacts on a substrate 10.

The apparatus has a first supply facility A for supplying the substrate 10. In the embodiment shown the substrate is a flexible foil, the substrate is for example a flexible polymer substrate, e.g. one of a polyethylene terephthalate (PET), polyethylene naphthalate (PEN) or a polyimide (PI).e.g. having a thickness in a range of 25 to 250 μm. The foil is provided by a supply roll A and the substrate 10 having the components 30 assembled therewith is wound onto a roll J.

The apparatus has a further facility B1 for placing the component 30 on a first main side 11 of the substrate 10. For this purpose pick and place devices are commercially available that have a placement accuracy of about 50 μm in position and about 1 degree in orientation.

The apparatus has a facility F for depositing a layer of an electrically conductive material or a precursor thereof, said layer 32 extending over an area of the substrate defined by the component to laterally beyond said area. In an embodiment the layer extends over the full area defined by the foil. In the embodiment shown the device has a curing facility G for curing the layer 32. The layer 32 may be applied by any printing facility, such as a screen printing facility or an inkjet printing facility. Typically the curing facility G is an actinic radiation source, e.g. a UV-source. However alternatively a heat source may be used as the curing facility in case the layer comprises a heat-curable component. In other embodiments the layer may cure by evaporation of a solvent therein. In again another embodiment a heated thermoplastic resin may be deposited as the layer that solidifies upon cooling.

The apparatus has a machine vision system C1, C2 that is arranged to estimate a position of the electric contacts of the components. The machine vision system comprises a camera, e.g. a CCD-camera C1 and a pattern recognition unit C2. Machine vision systems for this purpose are commercially available, for example from Orbotech.

The apparatus has a calculation unit H1 for calculating partitioning lines depending on the estimated position of the electric contacts and a partitioning unit H2 for partitioning the layer into mutually insulated areas by locally removing material from said layer along said partitioning lines.

An embodiment of a method according to the first aspect is now described with reference to FIG. 2A to 2D. In each of the FIGS. 2A to 2D a top view of the substrate 10 with the component 30 is shown (top half of Figure) as well as a cross-section (bottom half of Figure) according to the dashed line in the top view.

Figure 2A:
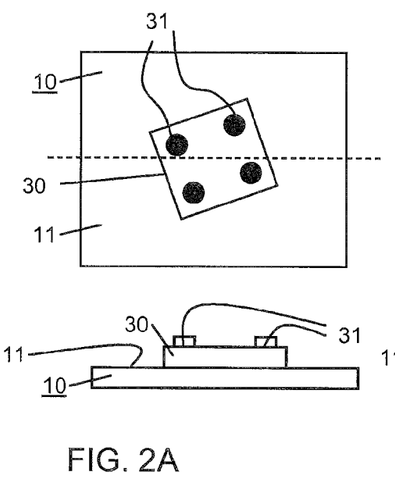
FIG. 2A shows a result of a first step of a first embodiment of a method according to the first aspect of the invention.

FIG. 2A shows a result obtained in a first stage of the method carried out with the apparatus of FIG. 1. This stage corresponds to point Xa at the production line shown in FIG. 1. Therein component 30 attached to the first main side 11 of the substrate 10 is shown, with its contacts 31 facing away from the substrate 10. Attachment of the component may be realized by an adhesive, for example thermally curable adhesive or an UV-curable adhesive. Alternatively an auto-curing multi-component adhesive may be used.

Figure 2B:
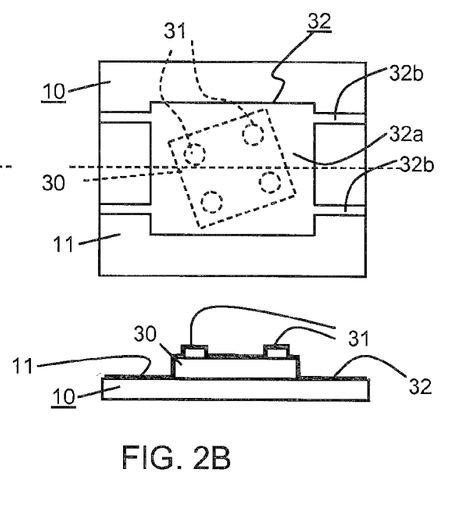
FIG. 2B shows a result of a second step of the first embodiment of a method according to the first aspect of the invention.

FIG. 2B shows a result obtained in a second stage of the method corresponding to point Xb at the production line. At this stage a layer 32 of a conductive material or precursor thereof is deposited at the first main side 11 of the substrate 10. The layer 32 extends over an area of the substrate 10 defined by the component 30 to laterally beyond said area. In the embodiment shown the layer 32 is prepatterned, here into a box-shaped portion 32a and line-shaped portions 32b. In another embodiment the layer 32 may homogeneously cover the first main surface 11 with the component 30.

As mentioned above the actual position of the electric contacts 32 may deviate from the planned position, due to inaccuracies in the placement of the component 30.

As illustrated in FIG. 1, the actual position of the contacts 31 is determined with a machine vision system C1, C2. Although the layer 32 covers the component 30 and its contacts 31, the position of the contacts 31 is generally well detectable due to the height profile induced in the surface of the layer 32 by the presence of the component 30. Nevertheless, it is an alternative possibility to detect the position of the contacts of the device before the step of depositing the layer 32.

Figure 2C:
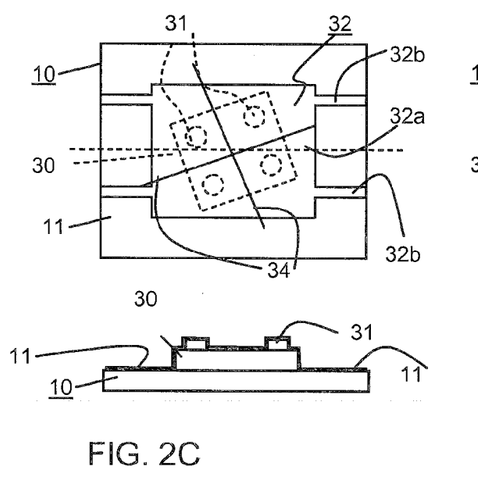
FIG. 2C shows a result of a third step of the first embodiment of a method according to the first aspect of the invention.
Figure 2D:
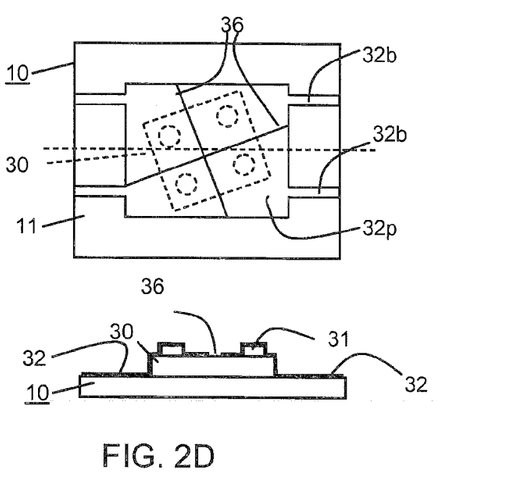
FIG. 2D is an assembly of an electronic component and a flexible substrate according to the third aspect of the present invention, the assembly is the result of a fourth step of the first embodiment of a method according to the first aspect of the invention.

Now the actual position of the electric contacts 31 is known, partitioning lines 34 are calculated as illustrated in FIG. 2C. Subsequently the layer 32 is partitioned into mutually insulated areas, e.g. 32p, by locally removing material from the layer along the partitioning lines 34. This corresponds to stage Xc in FIG. 1. The result thereof is shown in FIG. 2D, wherein 36 are slits in the layer 32.

In the example shown each of said mutually insulated areas, e.g. 32p connects a contact 31 to a respective line-shaped portion 32b, so that the contacts 31 of the component 30 can be connected to other devices via the line-shaped portions 32b of the electrically conductive layer 32. Alternatively an insulated area may extend over more than one contact if it is desired that these contacts are mutually connected.

Figure 1A:
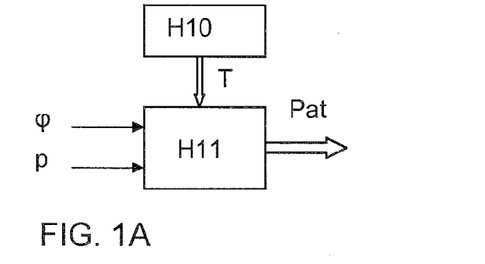
FIG. 1A shows an part of a second embodiment of an apparatus according to the second aspect of the invention in more detail.
Figure 1B:
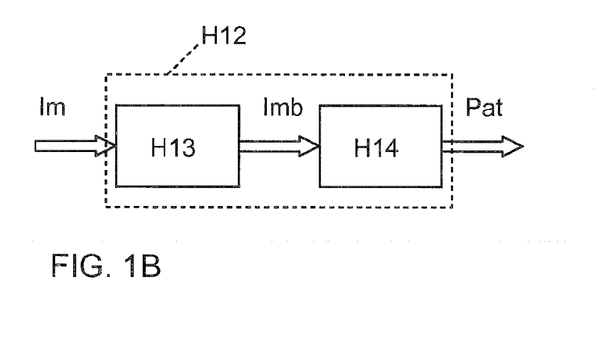
FIG. 1B shows an part of a third embodiment of an apparatus according to the second aspect of the invention in more detail.

Several methods are possible to calculate a partitioning pattern Pat comprising partitioning lines 34. This is illustrated by FIGS. 1A, and 1B wherein part of the calculation unit H1 is shown in more detail. For example a partitioning template may be used, which is given the proper orientation φ and position p corresponding to that of the component 30. For that purpose, as illustrated in FIG. 1A the apparatus may have a template memory H10 from which a template suitable for a particular component is selected and a transformation unit H11, which applies a transformation corresponding to the measured orientation φ and position p of the template, therewith obtaining the partitioning pattern Pat.

In another embodiment of the apparatus as illustrated with reference to FIG. 1B a partitioning pattern Pat is calculated with an image processing unit H12 directly from the detected image data Im. The image processing unit H12 for this purpose may for example have a first unit H13 that transforms the image Im into binary image Imb with a foreground representing the contacts of the component and a background representing the area outside the contacts. A second unit H14 applies a skeleton algorithm, e.g. Hilditch algorithm, to the binary image Imb to obtain a skeleton of the background. The skeleton so obtained forms the partitioning pattern Pat. Subsequently the layer 32 is partitioned into mutually insulated areas, e.g. 32d, by locally removing material from said layer along the partitioning lines in said partitioning pattern Pat.

Figure 3A:
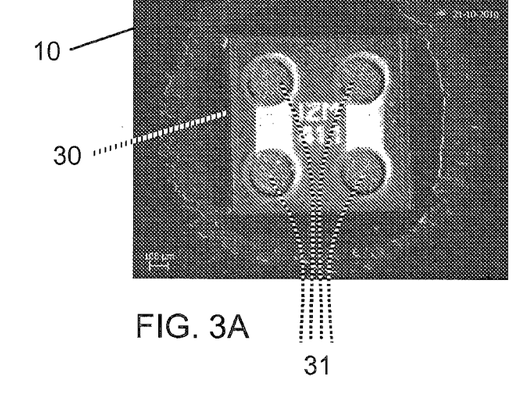
FIG. 3A is a photograph of a semi-finished product schematically shown in FIG. 2A.

By way of example a component 30 is shown in FIG. 3A having four electric contacts 31 was placed at a 25 μm thick PET foil with its contacts 31 facing away from the substrate. The component 30 had a lateral size of 0.8×0.8 mm and a thickness of 20 μm. The four contacts 31 had a diameter of 200 μm and were arranged with their centres according to vertices of a square having a size of 400 μm.

Figures 3B, 3C:
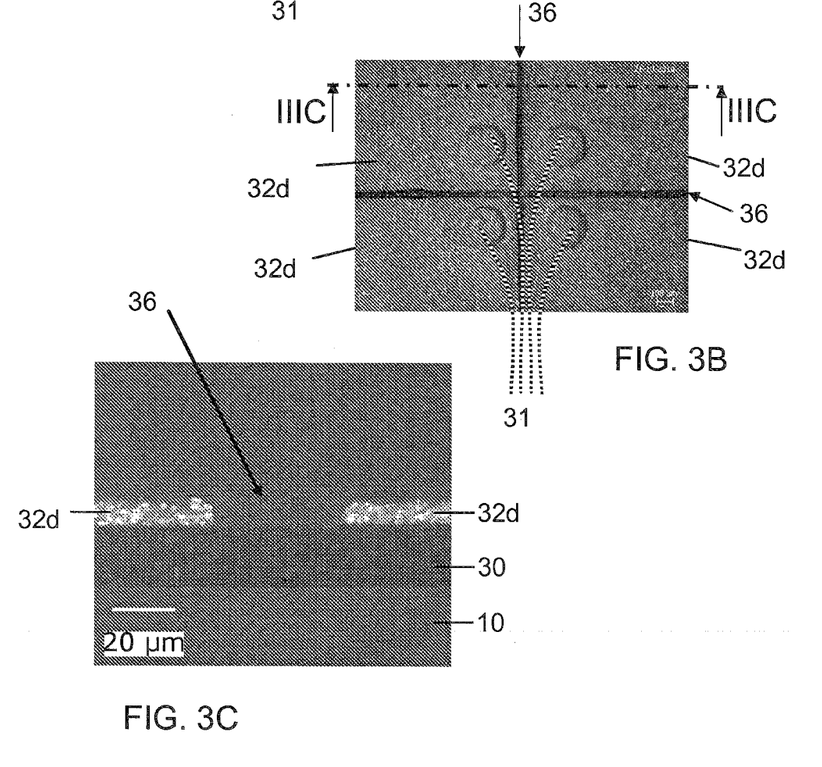
FIG. 3B is a photograph of the product schematically shown in FIG. 2D.
FIG. 3C is a photograph of the product according to cross-section IIIC-IIIC in FIG. 3B.

A layer of an electrically conductive material, here a screen print paste of type 5025 obtained from Dupont was applied by screen printing over the component 30 and the foil 10 and subsequently thermally cured. As shown in FIG. 3B the layer of electrically conductive material was subsequently partitioned into mutually insulated areas 32d separated by slits 36 having a width in the range of 15 μm to 50 μm for example, by locally removing the electrically conductive material by laser ablation. FIG. 3C further illustrates this in a cross-section according to IIIC-IIIC in FIG. 2B. For that purpose a Nd:YAG laser was used having a wavelength of 355 nm, operating at a frequency of 10 kHz and having a spot diameter of 17 μm. The laser operated with a speed of 20 mm/s, resulting in a fluence of 3.4 J/cm$^2$. Depending on the thickness of the layer 32 and the type of material used therefore a different laser with different settings may be used. The diameter of the laserbeam is maintained at constant width so that the width of the slits 36 is substantially constant, i.e. their width does not vary more than about 20% in comparison to their average value. In the embodiment shown the slits have a length of about 0.8 mm from the centre of the deposited layer to the edge. Accordingly the slits have a length/width ratio 53, greater than 10.

It is not necessary that the electrically conductive layer 32 is deposited at the side of the substrate 10 where the component 30 is placed.

The material deposited as the layer 32 is for example an ink containing metal nano particles. An example thereof is a silver nanoparticle dispersion in an ethylene glycol/ethanol mixture as provided by Cabot (Cabot Printing Electronics and Displays, USA). This silver ink contains 20 wt % of silver nanoparticles, with the particle diameter ranging from 30 to 50 nm. The viscosity and surface tension of this ink is 14.4 mPa·s and 31 mN m-1, respectively.

Alternatively metal complexes in organic or water based solvents may be used, for example silver complex inks comprising a mixture of solvents and silver amides, for example inks produced by InkTec. The silver amides decompose at a certain temperature between 130-150° C. into silver atoms, volatile amines and carbon dioxide. Once the solvents and the amines are evaporated, the silver atoms remain on the substrate. Other metal complexes based for example on copper, nickel, zinc, cobalt, palladium, gold, vanadium, and bismuth instead of silver may be used alternatively or in combination. However, particularly suitable are a silver complex, a copper complex, a nickel-complex, an aluminum-complex or any mixture thereof. Silver, copper, aluminum and nickel are excellent conductors. The following table shows some examples of materials to be deposited as the electrically conductive layer 32.

TABLE 1

Typical examples of substances comprising
a Cu-complex component

Cu(neodecanoate)2 (6-12% Cu; from Strem Chemicals)
Cu(acetate)2•H2O (from Sigma Aldrich)
complex with ethanolamine is soluble in water (concentration N/A)
Cu(formate) 2•4 H2O (from Gelest)

The electrically conductive layer 32 to be deposited may alternatively be a conductive polymer. Such a structure can be formed from a substance that comprises conductive polymer particles, for example suspended in a liquid. Examples of electrically conductive polymers are poly-(3,4-ethylenedioxythiophene) (PEDOT) or polyaniline (PANI). Instead a substance comprising a suspension of particles of a precursor for a conductive polymer may be used.

Figure 3D:
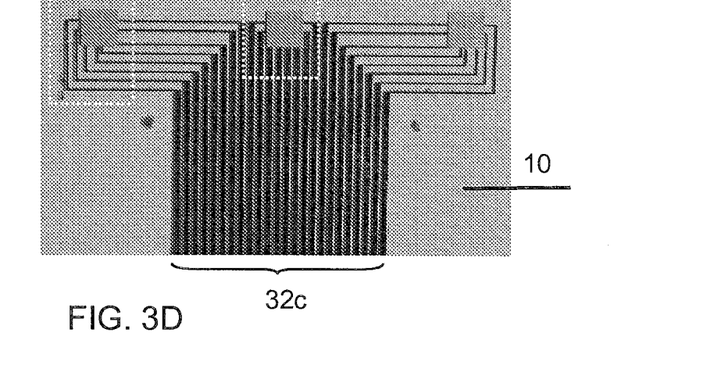
FIG. 3D is a photograph of flexible substrate comprising a plurality of components and printed circuitry for interconnected them.
Figure 3E:
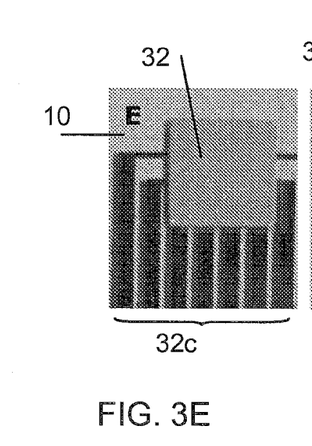
FIG. 3E shows a detailed photograph according to E in FIG. 3D.
Figure 3F:
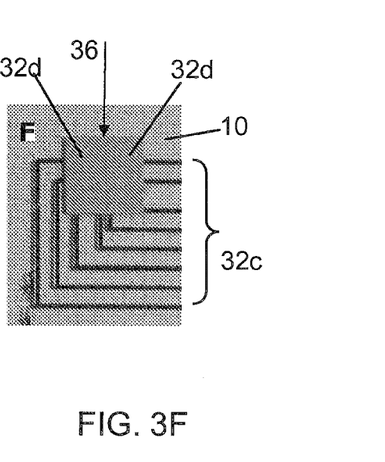
FIG. 3F shows a detailed photograph according to F in FIG. 3D.

FIG. 3D-F shows how the invention is applied to a foil comprising a plurality of embedded components. FIG. 3D is a photograph of flexible substrate comprising a plurality of components E,F already provided with an electrically conductive material or a precursor and printed circuitry 32c for interconnected them. As shown in more detail in the photograph of FIG. 3F, the layer 32 of component F is already partitioned into mutually insulated areas 32d. By way of comparison, the photograph of FIG. 3E shows that the layer 32 of component E is not yet partitioned.

Figure 4:
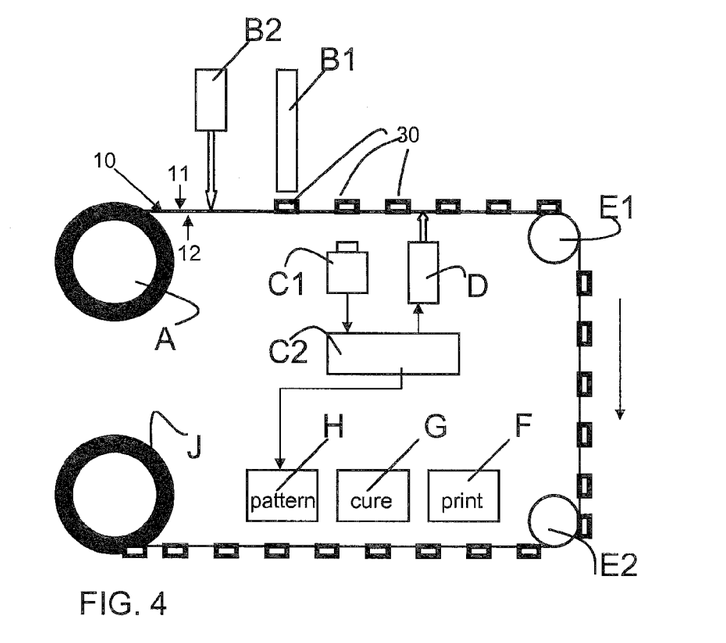
FIG. 4 shows a fourth embodiment of an apparatus according to the second aspect of the invention.

FIG. 4 shows an alternative apparatus according to the first aspect of the invention. In this embodiment the electrically conductive layer is deposited at a main side 12 of the substrate 10 opposite the side 11 of the substrate where the component 30 is placed.

The apparatus shown in FIG. 4 differs from the apparatus of FIG. 1 by an additional facility D for perforating the substrate 10, so as to obtain a via from the first main side 11 to the second main side 12 of the substrate 10 and to form an electrical contact with contacts 31 of the component 30. The facility D, for example a laser, e.g. a Nd-YAG laser is controlled by a computer vision system C1, C2 that detects the actual position of the electric contacts 31 of the component 30. In the embodiment shown the apparatus further has a facility B2 that forms a cavity in the substrate 10 at the location where the component 30 is to be placed. The facility B2 is for example a Nd-YAG laser with a beamwidth of 1.2 mm that is arranged to form a cavity having a corresponding diameter and with a depth of about 20 μm in a substrate having a thickness of 100 μm. In the embodiment shown the computer vision system C1, C2 is also used to provide the input data to the facility H to partition the electrically conductive layer 32 into mutually insulated areas by locally removing material from said layer along partitioning lines in a partitioning pattern.

The apparatus shown in FIG. 4 has guidance rolls E1, E2 that guide the substrate from the supply facility A along the facility B2 for forming the cavity, the facility B1 for placing the component 30, a camera C1 for registrating the component 30, the laser D for perforating the substrate 10, a screen-printing facility F for depositing the electrically conductive layer 32, a curing facility G for curing the deposited layer 32, and the patterning facility for partitioning the layer into mutually insulated areas by locally removing material from said layer 32 along partitioning lines of a partitioning pattern.

Figure 5A:
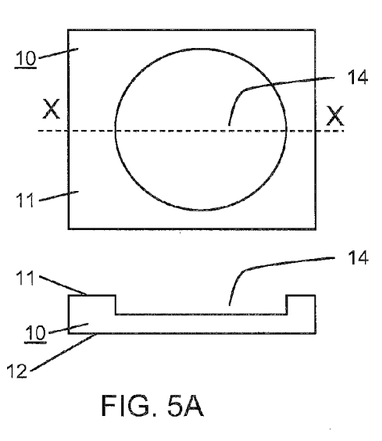
FIG. 5A shows a result of a first step of a second embodiment of a method according to the first aspect of the invention.
Figure 5B:
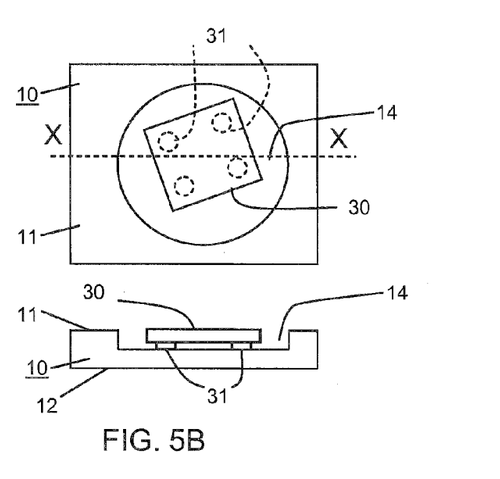
FIG. 5B shows a result of a second step of the second embodiment of a method according to the first aspect of the invention.

A method according to the first aspect that is performed by said apparatus during its operation is now illustrated with respect to FIG. 5A to FIG. 5 In FIGS. 5A and 5B a top view of the substrate 10 with the component 30 is shown (top half of Figure) as well as a cross-section (bottom half of Figure) according to the dashed line in the top view. In FIGS. 5C and 5D a bottom view of the substrate 10 with the component 30 is shown (lower half of Figure) as well as a cross-section (top half of Figure) according to the dashed line in the bottom view.

Figure 5C:
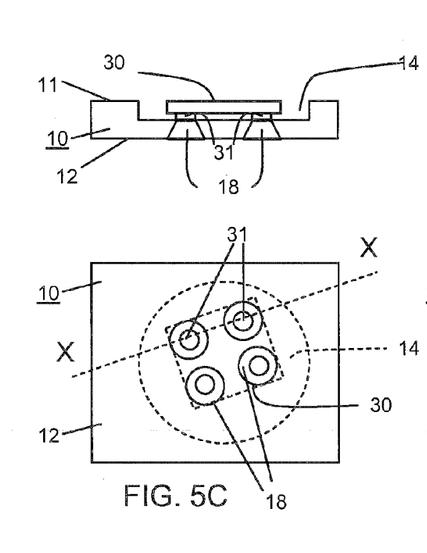
FIG. 5C shows a result of a third step of the second embodiment of a method according to the first aspect of the invention.

FIG. 5A shows a first stage wherein a cavity 14 is formed in the substrate 10 by facility B2 (FIG. 4). This embodiment of the method results in a product wherein the component 30 is sunken in the substrate, so that the upper surface of the component does not form a protrusion in the assembled product and therewith is less vulnerable to damages. A partial protection of the component is obtained if the component is partially sunken in the cavity. The cavity may have a depth larger than the height of the component, but this does not contribute to a further protection of the component and unnecessarily weakens the substrate. Next the component 30 is deposited in the cavity 14 by placing device B1 (FIG. 4), as is illustrated in FIG. 5B. Subsequently the substrate 10 is perforated by facility D (FIG. 4), so that perforations 18 are obtained that extend from the second main side 12 to the first main side 11 and that expose the electric contacts 31 of the component 30, as shown in FIG. 5C. In the embodiment shown, the perforations are obtained by laser drilling. The tapered perforations 18 so obtained widen towards the second main surface 12 of the substrate 10. This is advantageous as this improves reliability of an electric connection with the electric contact 31 in the bottom of the perforation 18. In the present case, where the substrate is a PET-foil of 25 μm, the perforations were obtained by application of 10 pulses with an energy density of 75 mJ/cm$^2$ from an excimer laser with a wavelength of 248 nm. Alternatively another laser may be used. For example a CO2 laser is used having a wavelength of 1 μm and an energy density of 1-1.5 J/cm$^2$. Also in this case a sequence of 10 pulses was found suitable to perforate a PET-foil of 25 μm. Depending on the thickness and the material used for the substrate a lower or higher number of laser pulses may be applied.

Subsequently, an electrically conductive layer 32 is applied at the second main side 12 that extends over an area of the substrate defined by the component to laterally beyond said area, by the facility F, e.g. a screen printing facility. The printed material therewith also penetrates the perforations 18 and contacts the electric contacts 31 of the component 30. Due to the tapered shape of the perforations 18 the penetration of the printed material is facilitated.

Subsequently the electrically conductive layer 32 is cured by curing facility G, e.g. a UV curing facility.

Figure 5D:
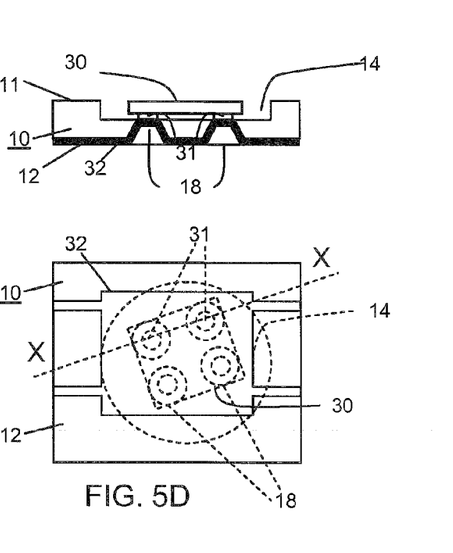
FIG. 5D shows a second embodiment of an assembly of an electronic component and a flexible substrate according to the third aspect of the present invention, the assembly is the result of a fourth step of the second embodiment of a method according to the first aspect of the invention.

The cured layer 32 is then partitioned into mutually insulated areas 32d by locally removing material from said layer along partitioning lines of a partitioning pattern in accordance with the estimated position of the electric contacts 31 of the component 30. The partitioning pattern may be calculated in a way similar as was described with reference to FIGS. 1A and 1B. It is however conceivable that a separate machine vision system are used. As shown in FIG. 5D the layer 32 is in this case partitioned into four mutually insulated areas 32d that are each electrically connected to a respective electric contact 31 of the component 30. In the embodiment shown the position of the electric contacts is estimated by the machine vision system C1, C2 that is also used to determine the required position for the perforations 18.

Figure 6:
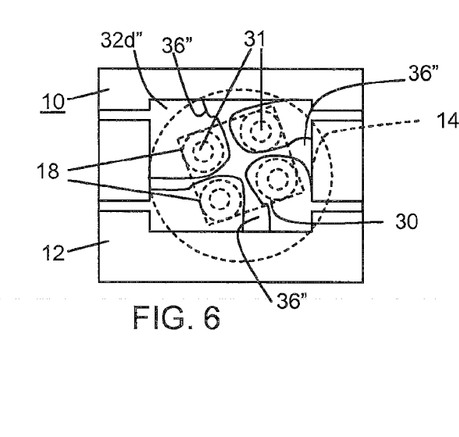
FIG. 6 shows a third embodiment of an assembly of an electronic component and a flexible substrate according to the third aspect of the present invention.

It is noted that it is not necessary that the partitioning lines in the partitioning pattern are straight lines. It is alternatively possible that the electrically conductive layer is partitioned by a partitioning pattern with curved lines, as is illustrated schematically in FIG. 6. In the embodiment shown therein the electrically conductive layer is partitioned into mutually insulated areas 32d" by curved slits 36" corresponding to curved partitioning lines in the partitioning pattern.

Figure 7:
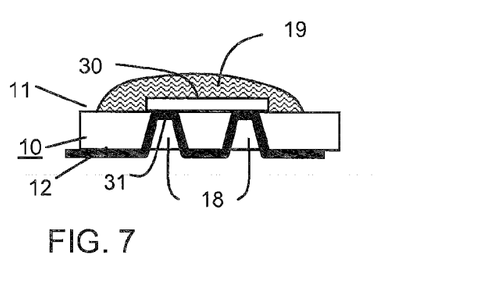
FIG. 7 shows a fourth embodiment of an assembly of an electronic component and a flexible substrate according to the third aspect of the present invention.

FIG. 7 shows an alternative for the assembly of FIG. 5D. The assembly of FIG. 7 is obtained in a way similar as described for the assembly of FIG. 5D. However the component 30 is not sunken into a cavity in the substrate 10, but is encapsulated by a layer 19 of protective material, e.g. a cured adhesive. In another embodiment these measures may be combined in that the component 30 is partially sunken into a cavity in the substrate and that its portion extending out of the cavity is protected by a layer of protective material.

Figure 8A:
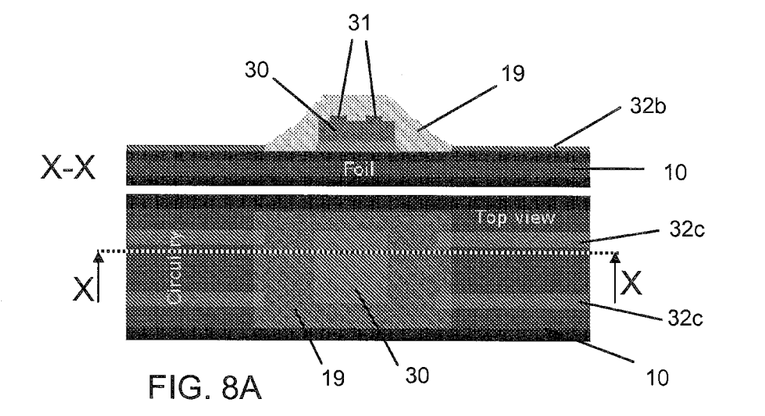
Figure 8B:
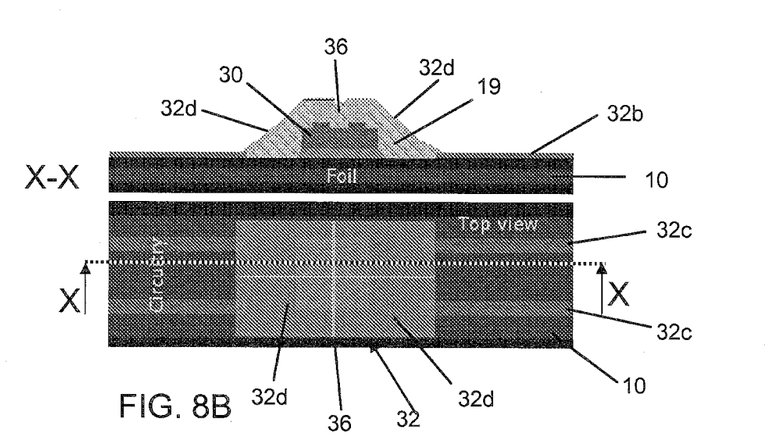

FIGS. 8A and 8B serve to illustrate a fourth embodiment of an assembly of an electronic component and a flexible substrate according to the third aspect of the present invention. Therein FIG. 8B shows the finished product, and FIG. 8A shows a semifinished product.

The bottom part of FIG. 8A shows in top-view a semifinished product. The top part of FIG. 8A shows a cross-section according to line X-X in the top view. In this semi-finished product the component 30 is encapsulated by an adhesive 19. The foil is further provided with electrical conductors 32c. The contacts 31 of the component are exposed by openings in the encapsulation formed by the adhesive.

The bottom part of FIG. 8B shows in top-view the resulting product. The top part of FIG. 8B shows a cross-section according to line X-X in the top view FIG. 8B shows how subsequently a layer 32 of an electrically conductive material is applied over the component. The layer extends over an area of the substrate 10 defined by the component to laterally beyond said area over the electric conductors 32c. The layer 32 is partitioned into mutually insulated areas 32d by locally removing material from said layer along said partitioning lines. Therewith slits 36 are formed in the layer.

FIGS. 8A and 8B each show a top-view and a cross-section according to X-X indicated in the bottom-view.

Other variations to the disclosed embodiments can be understood and effected by those skilled in the art in practicing the claimed invention, from a study of the drawings, the disclosure and the appended claims. In the claims the word "comprising" does not exclude other elements or steps, and the indefinite article "a" or "an" does not exclude a plurality. A single processor or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. Method for assembling a component with a substrate, the component having electric contacts, the method comprising the steps of placing the component on a first main side of the substrate, applying a machine vision step to estimate a position of the electric contacts, depositing an electrically conductive material or a precursor thereof, characterized in that the electrically conductive material or a precursor thereof is deposited as one or more layers extending over an area of the substrate defined by the component to laterally beyond said area, and further characterized by the steps of calculating partitioning lines depending on the estimated position of the electric contacts, partitioning the layer into mutually insulated areas by locally removing material from said layer along said partitioning lines.

2. Method according to claim 1, wherein one or more of the electric contacts of the component face away from the substrate and wherein one of the one or more layers is deposited at the first main side of the substrate.

3. Method according to claim 1 or 2, wherein one or more of the electric contacts of the component face towards the substrate, the method comprising the additional step of applying perforations in the substrate so that said one or more of the electric contacts of the component face towards the substrate are exposed at a second main side of the substrate and wherein one of the one or more layers is deposited at the second main side.

4. Method according to claim 3, wherein the perforations in the substrate taper outwards in a direction from the first main side to the second main side of the substrate.

5. Apparatus for assembling a component with a substrate, the component having electric contacts, the apparatus comprising a first facility for placing the component on a first main side of the substrate, a second facility for applying a machine vision step to estimate a position of the electric contacts, a third facility for depositing an electrically conductive material or a precursor thereof, characterized in that the third facility is arranged to deposit the electrically conductive material or a precursor thereof as one or more layers extending over an area of the substrate defined by the component to laterally beyond said area, and further characterized by a fourth facility for calculating partitioning lines depending on the estimated position of the electric contacts, a fifth facility for partitioning the layer into mutually insulated areas by locally removing material from said layer along said partitioning lines.

6. Apparatus according to claim 5, further comprising a facility for forming a cavity in the substrate for receiving the component.

7. Apparatus according to claim 5, further comprising a facility for perforating the substrate so as to form perforations that expose electric contacts of the component at the second main side of the substrate.

8. Assembly of an electronic component with a flexible substrate, the component having electric contacts, the assembly comprising an electrically conductive material or a precursor thereof, characterized in that the assembly comprises the electrically conductive material or a precursor thereof as one or more layers extending over an area of the substrate defined by the component to laterally beyond said area, and in that Said layer is partitioned into mutually insulated areas by at least one slit in said layer having a substantially constant width that is at least 10 times smaller than its length.

9. Assembly according to claim 8, wherein the length/width ratio of the slits is at least 20.

* * * * *